United States Patent [19]
Stut

[11] 3,980,942
[45] Sept. 14, 1976

[54] APPARATUS FOR THE CONTROL OF ELECTRICAL HEATING OF A SEMICONDUCTOR ROD

[75] Inventor: Hans Stut, Groebenzell, Germany

[73] Assignee: Siemens Aktiengesellschaft, Berlin & Munich, Germany

[22] Filed: Oct. 24, 1972

[21] Appl. No.: 299,942

[30] Foreign Application Priority Data
Oct. 27, 1971 Germany............................ 2153566

[52] U.S. Cl. ............................. 323/19; 23/273 SP; 330/86; 330/108
[51] Int. Cl.² ......................................... G05F 1/46
[58] Field of Search ............... 330/75, 86, 110, 105, 330/108, 150, 152, 16; 323/20, 94, 40, 19; 23/273 SD, 301 SP

[56] References Cited
UNITED STATES PATENTS

| | | | |
|---|---|---|---|
| 3,082,381 | 3/1963 | Morrill et al...................... | 330/86 X |
| 3,373,959 | 3/1968 | Petersen ........................... | 330/86 X |
| 3,378,639 | 4/1968 | Dufendach et al. ................ | 330/16 |
| 3,577,090 | 5/1971 | Montgomery, Jr. ............ | 330/151 X |
| 3,602,804 | 8/1971 | Randall............................. | 323/40 X |
| 3,602,833 | 8/1971 | Barnette ........................ | 330/108 X |
| 3,623,140 | 11/1971 | Nercessian......................... | 323/40 X |
| 3,700,412 | 10/1972 | Higashi et al.................... | 23/273 SP |
| 3,715,651 | 2/1973 | Ott......................................... | 323/4 |

Primary Examiner—Gerald Goldberg
Attorney, Agent, or Firm—Hill, Gross, Simpson, Van Santen, Steadman, Chiara & Simpson

[57] ABSTRACT

An arrangement for electrically heating a semiconductor rod which is simultaneously growing by means of materials deposited from a gas phase, wherein the heating current circuit is formed by a heating current source and an electronic switch which is controllable by a variable auxiliary voltage. The heating current is applied to a smoothing circuit by way of a rectifier circuit which is coupled with the heating current circuit. The initial voltage of the smoothing circuit is compared with a desired voltage and the difference voltage determined by this comparison serves to control the generator which supplies the auxiliary voltage. The smoothing circuit is coupled with a preamplifier whose output is connected with the movable tap of a potentiometer. A fixed terminal of the potentiometer is connected to a source which supplies the desired voltage and to the input of a subsequent control amplifier. Another fixed contact of the potentiometer is connected in a feedback circuit to the input of the preamplifier.

4 Claims, 4 Drawing Figures

3,980,942

APPARATUS FOR THE CONTROL OF ELECTRICAL HEATING OF A SEMICONDUCTOR ROD

BACKGROUND OF THE INVENTION

1. Field of the Invention

This invention relates to an arrangement for electrically heating a semiconductor rod which is simultaneously growing due to a deposition thereon of materials from a gas phase. More specifically, the invention relates to such a heating arrangement which is comprised into a heating current circuit together with a heating current source which supplies alternating currents $U(t)$ having a period T and an electronic switch which can be controlled by a time-wise variable auxiliary voltage $V(t)$, which heating current circuit conducts the heating current $I(t)$ supplied from the heating current source. The heating current $I(t)$ is effective by way of a second circuit which is inductively coupled to the heating current circuit and has rectifier characteristics and to a smoothing four terminal circuit whereby the difference $\Delta = G - G_0$ of the direct voltage G which is received at the output of the smoothing circuit serves with its desired value $G_0$ to control a generator for the auxiliary voltage in such a way that the auxiliary voltage is activated earlier for larger values of the difference $\Delta$.

2. Description of the Prior Art

During the production of a highly pure crystalline semiconductor material according to the above mentioned method the depositing process is generally directed at several rods of small diameter which thereafter, during the running of the process gradually grow due to the deposition thereon of the semiconductor material. In the case of arrangements heretofore used for heating the rods, the heating current is generally taken from a voltage source which is connected to the public mains. Since this voltage source is almost equal to a source of constant voltage, and since the process requires a source of constant current, the heating arrangements incorporate current limiting components which regulate the heating current to a constant value due to the negative resistance characteristic of the semiconductor material and, for example, consist of phase controlled thyristors.

Since the heat dissipation to the surroundings for a prescribed rod temperature, which has to be maintained, depends on the surface of the semiconductor rod, the heating current which is regulated to a constant value due to the growth of the rod must increase during the deposition process in proportion to the rod surface.

The electronic switch which is controlled by way of a regulator in such a way that the heating current is maintained at a constant level offers itself as the best current limiting component, whereby the regulating magnitude of the actual current value is the heating current itself.

The heating current increases, as already shown during the course of the deposition process, since the electrical energy which is transformed in the semiconductor rod for maintaining the desired temperature equal the heat dissipation to the surroundings, the heat dissipation itself, with other conditions of the surface remaining unchanged, being proportional to the diameter of the semiconductor rod.

It has been proven that it is necessary and also advisable, in the case of arrangements which were heretofore employed, to arrange the current control in such a way that as large a current control range as possible, for example 1:100 can be achieved. However, special measures are required since the methods which are generally used for the current control lead to an undesirable amount of imperfections and the quality of the deposited material does not correspond to the requirements for the semiconductor rods, with respect to purity and homogeneity of the semiconductor rod, and in particular in the case of rational operation of the arrangement the quality of the deposited material does not correspond to the requirements with respect to the desired thickness of the rod. This large range of control has, however, high requirements with respect to the control components, particularly the amplifier, so that extraordinary requirements are made either with respect to the components as far as quality and the admissible imperfection limits are concerned, or on the other hand the amplification of the current control has to be changed during the running of the process.

SUMMARY OF THE INVENTION

The present invention is directed to an arrangement whereby a large range of control, for example 1:100, can be achieved and whereby the amount of imperfections is kept within such limits that the requirements of purity and homogeneity, in particular in case of the required thickness of the semiconductor rod, are fulfilled. In addition, standard components, in particular amplifiers of standard construction and quality, may be used.

It is a particular aspect of the invention to replace the usually applied method of the formation of the desired-actual value difference by changing the desired value (which leads to an undesirable high amount of imperfections which in particular are to be found in the lower range of control in the magnitude of 100% of the standard amount) by the method of adjusting the actual value, which means to form the difference by changing or adjusting the actual value whereby the desired value is adjusted to a constant value $G_0$. In this method, the control amplifier operates exclusively in the upper working region whereby the imperfection is reduced to a minimum, that is the imperfection size referred to the maximum value. The method of the actual value adjustment in addition offers the advantage that the control circuit amplification is constant across the entire control range in the first approach and therefore the control circuit stability is favorably influenced.

This is possible by feeding back a magnitude to the input of the amplifier which increases greater than proportionally with an increase of the desired value. For this purpose, a potentiometer for the actual value adjustment can be used if one of the fixed terminals of the potentiometer is connected in a feedback network extending from the output of the amplifier to the input of the amplifier and therefore provides that a value is fed back which increases in excess of proportionally to the input voltage of the amplifier. The resistance portion of the potentiometer which is coupled into the feedback circuit is decreased, according to the invention, in proportion to the input voltage.

According to the invention, the potentiometer is divided into areas of different changes of resistance so that an operational advantage is also achieved whereby a constant condition of the current change of the heating current in its instantaneous value is obtained, which is to be adjusted according to the unit path ($\alpha$) of the potentiometer, whether the unit be linear or angular, depending on the type of potentiometer employed.

In the lower operational field of the potentiometer, the control path is expanded whereby also in this case an accurate heating current adjustment is made possible; however, in the upper operational field the control path is shortened whereby the required large heating current change is achieved.

BRIEF DESCRIPTION OF THE DRAWINGS

Other objects, features and advantages of the invention, its organization, construction and operation will be best understood from the following detailed description taken in conjunction with the accompanying drawings, on which.

DESCRIPTION OF THE PREFERRED EMBODIMENTS

The present invention is an improvement over and may advantageously be utilized with the arrangement disclosed in my copending application Ser. No. 269,154, filed June 5, 1972, now U.S. Pat. No. 3832626. In that arrangement a semiconductor rod and a controlled semiconductor switch are serially connected across a source of alternating current. The primary winding of the transformer is also serially connected in the loop and has a secondary winding associated therewith which feeds a full-wave rectifier. The rectifier is in turn connected by means of a filter to a pair of cascaded amplifiers which control the operation of the semiconductor switch. In that disclosure, the filter circuit is referenced 7 and the amplifiers are referenced 10 and 11. The same components are also referenced 7, 10 and 11 in the following description.

Figure 1:
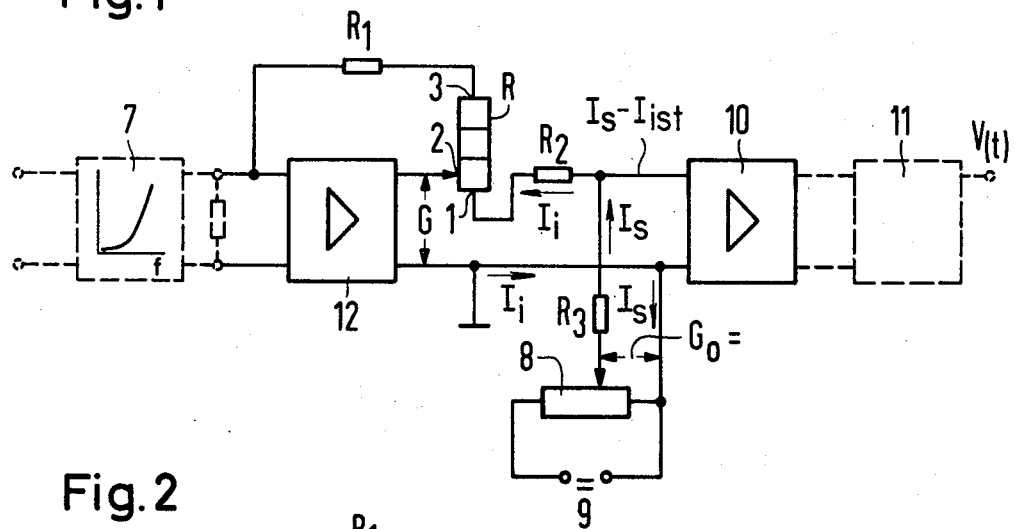
FIG. 1 is a schematic circuit diagram of a control arrangement constructed in accordance with the principles of the present invention.
Figure 2:
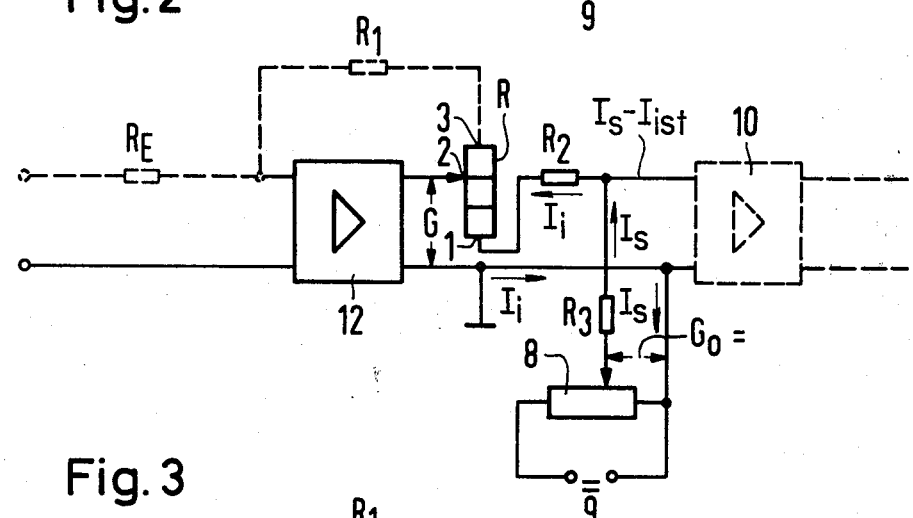
FIGS. 2 and 3 are schematic circuit diagrams which illustrate portions of the circuit of FIG. 1.
Figure 3:
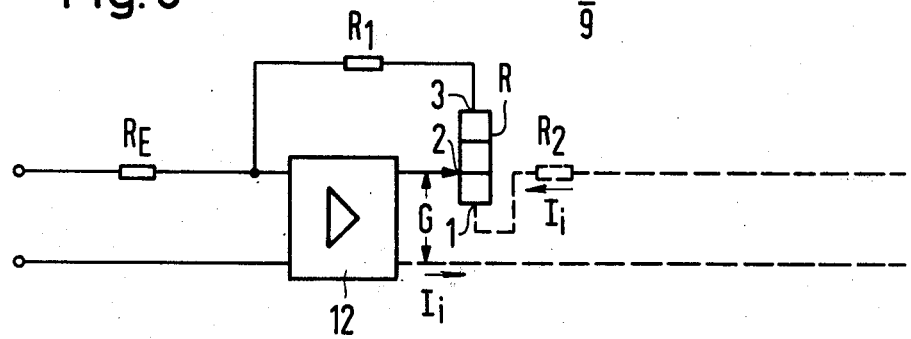

Referring to FIGS. 1–3, the present invention provides a preamplifier 12 connected between a filter 7 and a control amplifier 10. The preamplifier 12 supplies a direct current G. The output of the amplifier 12 is connected with a movable tap 2 of a potentiometer $R_{pot}$ which has a first fixed terminal 1 that is connected to the amplifier 10 by way of a resistor $R_2$ and a second fixed terminal 3 which is connected in a feedback circuit with a resistor $R_1$ to the input of the preamplifier 12.

The potentiometer $R_{pot}$ itself is connected into the feedback circuit in such a way that in case of a maximum value of the direct voltage G, a maximum range of resistance is provided and in case of a minimum value of the direct voltage G a minimum range or resistance is provided in the circuit which compares the direct voltage G with the desired value $G_O$. In this manner the desired voltage $G_O$ is adjusted to a constant value. The potentiometer consists of differentially measured zones of resistance which are constructed in such a relation to each other that the heating current is adjustable across the entire adjustment range with an approximate constant ratio of the current change of the heating current due to its instantaneous value per unit path of the potentiometer such potentiometers are known as "function potentiometers" and are generally available on the market.

Figure 4:
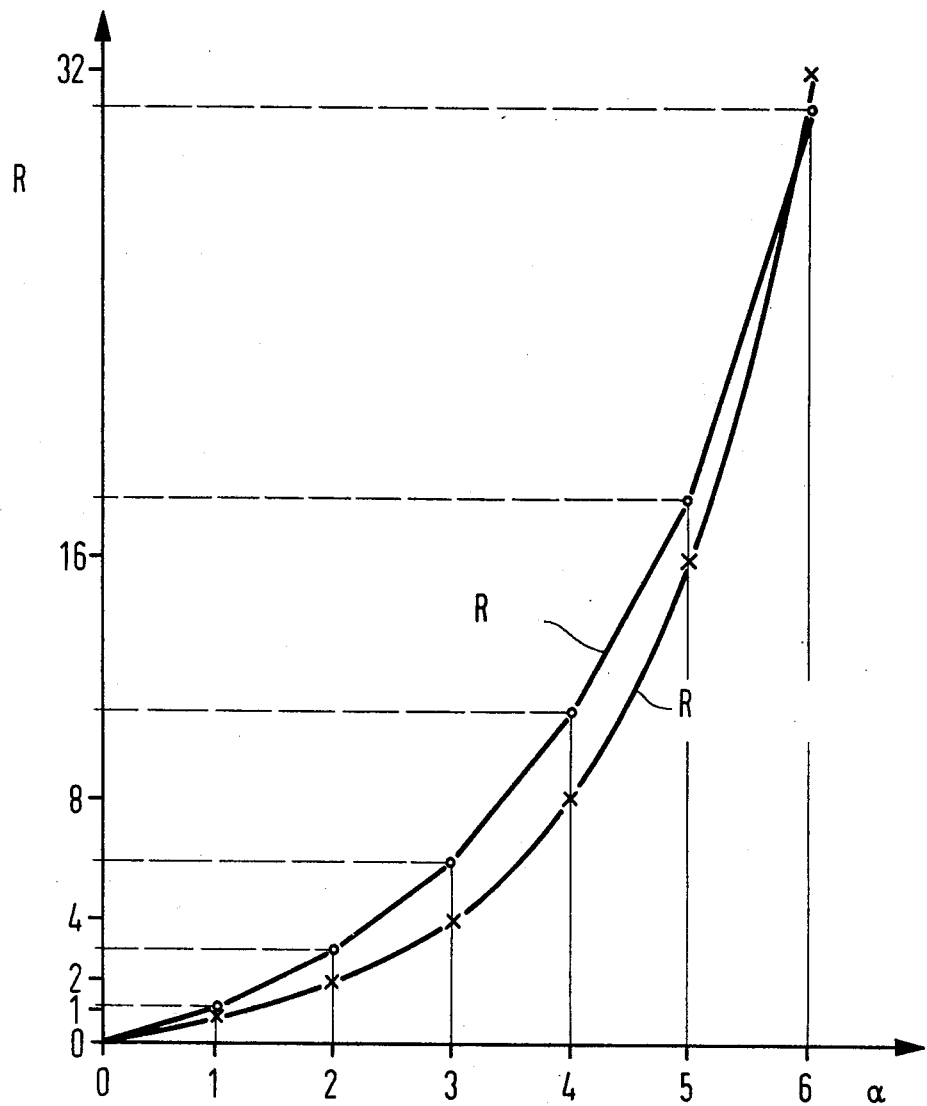
FIG. 4 is a graphic illustration of potentiometer resistance with respect to unit changes of potentiometer setting.

More specifically, and also referring to FIG. 4, FIG. 1 illustrates in a concise manner that part of an arrangement concerning the invention which is designed for the electrical heating of a semiconductor rod which is simultaneously growing due to a deposition of semiconductor material from a gas phase. In FIG. 2, that portion of the circuit which compares the actual value G with the desired value $G_O$ is illustrated, while FIG. 3 specifically illustrates that part of the circuit including the feedback of the actual value G to the input of the preamplifier 12.

By means of the fixed adjustment of the desired value of the voltage $G_O$ which is illustrated in FIG. 2, namely the upper third of the adjustment zone of the desired value, a constant value of the desired value current is achieved in accordance with the expression $$I_s = G_O/R_3 = \text{constant}$$

and the internal resistance 8 of the desired voltage source is neglected.

The actual value current results from the condition $$I_{actual} = G_1/(R_{pot\ 1,2} + R_2)$$

Since the arrangement endeavors to permit the difference of actual and desired values to change toward zero, where $I_{actual} = I_{desired}$ a dependency of the actual voltage value on the partial resistance $R_{1,2}$ of the potentiometer resistance $R_{pot}$ which is connected in the control circuit will result, and therefore a direct dependency of the heating current on the position of the potentiometer tap 2 shows that $$G = f(R_{pot\ 1,2})$$

It becomes evident from the foregoing expression that the actual value G which is in proportion to the heating current is adjusted or changed respectively for the control of the heating current by means of the potentiometer. However, the potentiometer serves the desired value adjustment of the heating current by changing the actual value.

Thereby $G_O$ is chosen in such a way that the operating range always lies in the upper third of the input voltage, for example 8 volt in case of a maximum 10 volt input voltage of the subsequently connected amplifier 10.

FIG. 3 stresses that part of the circuit which shows the feedback of the output voltage G of the amplifier 12 to its input. Since the amplification of the preamplifier equal the ratio of the resistance in the feedback circuit to the input resistance the following expression holds true.

$$V = (R_1 + R_{pot\ 2,3})/R_E$$

The amplification is in proportion to the resistance portion $R_{2,3}$ of the potentiometer which is connected into the feedback circuit.

Since, however, the resistance value $R_{2,3}$ which is connected into the feedback circuit becomes smaller as the value G increases, the amplification of the preamplifier is decreased depending on the value G, while the value G is increasing and the requirements from the dynamics of the amplifier according to the invention is decreased. For reasons of stability, the expression $$V_{max} \approx (R_3 + R_{pot\ 2,\ 3})/R_E = 10$$

is chosen.

In order to be able to accurately adjust the large required control range 1:100 of the heating current in the lower range a current value which is adapted to the depositing process, and in order to achieve in the upper range the required large current change, it is advisable, according to the invention, to design the potentiometer for the actual value adjustment in such a way that it controls across the entire control range with a constant ratio of the current change $\Delta I$ of the heating current at its instantaneous value, that is with $\Delta I/I$ = constant per path (linear or angular) unit of the potentiometer.

As illustrated in FIG. 4, the resistance of the potentiometer $R_{pot}$ has to be designed in such a way that the resistance change per unit ($\alpha$) of the potentiometer tap changes in a potential ratio. By means of the previously mentioned steps, however, the requirements with respect to the course of the resistance change are decreased considerably since the controllable feedback is already effective in this direction.

Therefore, and for technical reasons as well as economic considerations, the potentiometer is composed of partial zones which are constructed in such a way that the resistance changes are constant per partial zone and approximates, according to FIG. 4, the ideal curve of the resistance change.

By the connecting of the potentiometer as illustrated in FIGS. 1–3 for the actual value adjustment, by means of which the desired value of the heating current is adjusted, and by the structure of the potentiometer which is explained by means of FIG. 2, it has been provided, according to the invention, that by simple means the current adjustment across the entire control range can be carried out with an upper constant $\Delta I/I$ in the case of the extremely large control range 1:100 of the heating current, and that the requirements with respect to purity and homogeneity of the semiconductor material is provided by means of equal path or angle change of the potentiometer tap so that the heating current can be accurately adjusted also in the lower range, and that the requirements with respect to quality of the amplifier can be reduced considerably as the control loop amplification in the first approximation is constant across the entire control range.

Although I have described my invention by reference to a specific illustrative embodiment, many changes and modifications thereof may become apparent to those skilled in the art without departing from the spirit and scope thereof. I therefore intend to include within the patent warranted hereon all such changes and modifications as may reasonably and properly be included within the scope of my contribution to the art.

I claim:

1. In an arrangement for electrically heating a semiconductor rod which is simultaneously growing due to the deposition of semiconductor material thereon from the gas phase in which a heating current source supplies alternating current U(t) having a period T to the rod and an electronic switch is controllable by a time variable auxiliary voltage for applying the alternating current to the rod, the auxiliary voltage being derived in a control loop which includes a transformer connected between the heating current circuit and a rectifier, a filter connected to the rectifier and amplifying means connected between the filter and the electronic switch, the improvement therein comprising: a circuit interposed between the filter and the amplifying means including a preamplifier and a first potentiometer, said first potentiometer including a pair of fixed terminals and a movable tap, said preamplifier including an input connected to the filter and an output connected to said movable tap, one of said fixed terminals of said first potentiometer connected in a feedback circuit to said input of said preamplifier and the other fixed terminal of said first potentiometer connected to the amplifying means which controls the electronic switch, said preamplifier providing an output direct voltage to the subsequent amplifying means, and means, including a second potentiometer, for supplying a reference voltage connected to the output of said preamplifier and to the input of said amplifying means for comparing the reference voltage with the output voltage of said preamplifier whereby the difference between the reference voltage and the output voltage of the preamplifier is effective for operating the subsequent amplifying means.

2. In an arrangement according to claim 1 wherein said first potentiometer is constructed to provide a maximum resistance range for a maximum value of direct output voltage of the preamplifier and a minimum resistance for a minimum value of direct output voltage of said preamplifier.

3. In an arrangement according to claim 1, wherein said reference voltage is a constant value.

4. In an arrangement according to claim 1 wherein said first potentiometer includes a plurality of resistance zones each having a different change in resistance per unit of adjustment of said tap so that the heating current is adjustable over the entire adjustment range with an approximately constant ratio of the current change of the heating current to its instantaneous value.

* * * * *